(12) United States Patent
Doucet et al.

(10) Patent No.: US 9,047,427 B1
(45) Date of Patent: Jun. 2, 2015

(54) METHOD AND SYSTEM FOR PERFORMING VERIFICATION OF AN ELECTRONIC DESIGN

(75) Inventors: Frederic Doucet, San Jose, CA (US); Robert P. Kurshan, New York, NY (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 13/288,836

(22) Filed: Nov. 3, 2011

(51) Int. Cl.
*G06F 17/50* (2006.01)

(52) U.S. Cl.
CPC .......... *G06F 17/504* (2013.01); *G06F 17/5081* (2013.01)

(58) Field of Classification Search
CPC .............. G06F 17/504; G06F 2217/86; G06F 17/5022; G06F 17/5036; G06F 17/5081; G06F 17/5045
USPC .......................................... 716/106; 703/13
See application file for complete search history.

(56) References Cited

U.S. PATENT DOCUMENTS

| | | | |
|---|---|---|---|
| 5,801,958 A | 9/1998 | Dangelo et al. | |
| 7,937,673 B1 | 5/2011 | Kurshan et al. | |
| 2001/0037492 A1 | 11/2001 | Holzmann | |
| 2004/0123254 A1 | 6/2004 | Geist et al. | |
| 2007/0156378 A1 | 7/2007 | McNamara | |
| 2007/0250799 A1 | 10/2007 | Bunin et al. | |
| 2008/0263486 A1* | 10/2008 | Alexanian et al. | 716/5 |
| 2009/0150136 A1 | 6/2009 | Yang | |
| 2009/0164968 A1* | 6/2009 | Kurshan et al. | 716/18 |
| 2011/0184713 A1* | 7/2011 | Yang | 703/13 |
| 2011/0184714 A1* | 7/2011 | Zhang et al. | 703/13 |
| 2013/0232465 A1* | 9/2013 | Goossens | 717/104 |

OTHER PUBLICATIONS

Namjoshi, K. S., et al., Syntactic Program Transformations for Automatic Abstraction, Lecture Notes in Computer Science, 2000, vol. 1855, pp. 435-449.
Hojati, R., et al., A unified Approach to Language Containment and Fair CTL Model Checking, DAC '93 Proceedings of the 3oth international Design Automation Conference, 1993, pp. 4 75-481.
Xie, F., et al., Translating Software Designs for Model Checking, Lecture Notes in Computer Science, 2004, vol. 298412004, pp. 324-338.
Kurshan, R. P., Program Verification, Notices of the American Mathematical Society, 2000, vol. 47, Part 5, pp. 534-545.
Kurshan, R. P., Computer-Aided Verification of Coordinating Processes: The Automata-Theoretic Approach, Priceton University Press, Feb. 1995.
G. Berry et al., Communicating Reactive Processes, POPL, 1993.

(Continued)

*Primary Examiner* — Vuthe Siek
(74) *Attorney, Agent, or Firm* — Vista IP Law Group, LLP (57) ABSTRACT

An improved approach for designing and verifying electronic designs at different levels of abstractions is disclosed. An electronic design undergoes high level verification, where the results of the high level verification can be guaranteed to be correct at the RTL level. This can be implemented by ensuring that model consistency rules are followed to generate high level (enhanced transaction level) models and/or RTL data. In this way, properties that are verified at one level of abstraction will not need to be re-verified at the other level of abstraction.

26 Claims, 9 Drawing Sheets

(56) References Cited

OTHER PUBLICATIONS

G. Berry et al., System level design and verification using a synchronous language, IEEE/ACM international conference, 2003, p. 433, Washington, DC, USA.

G. Berry et al., The Esterel Synchronous Programming Language: Design, Semantics, Implementation, Science of Computer Programming, vol. 19, No. 2, pp. 87-152, 1992.

G. Berry, The Foundations of Esterel, 2000, MIT Press.

D. Harel, Statecharts: A visual formalism for complex systems, Sci. Comput. Program., vol. 8, No. 3, pp. 231-274, 1987.

D. Harel et al., The Statemate semantics of statecharts, ACM Transactions on Software Engineering and Methodology, vol. 5, No. 4, pp. 293-333, 1996.

R. Alur et al., Reactive modules, pp. 7-48, vol. 15, No. 1, 1999.

R. Alur et al., Modular refinement of hierarchical reactive machines, POPL '00: Proceedings of the 27th ACM SIGPLAN-SIGACT symposium on Principles of programming languages, pp. 390-402, 2000, New York, NY, USA.

R. Alur et al., Modular refinement of hierarchic reactive machines, ACM Trans. Program. Lang. Syst., pp. 339-369, vol. 26, No. 2, 2004.

S. Abdi et al., System-level verification with model algebra, CECS, UCI, Tech. Rep. 04-29, Nov. 2004.

S. Abdi, Functional verification of system level model refinements, Ph.D. dissertation, University of California, Irvine, 2005.

S. Abdi et al., Verification of system level model transformations, International Journal of Parallel Programming, , pp. 29-59, vol. 34, No. 1, Mar. 2006.

A. Flaisher et al., Case study: Integrating fv and dv in the verification of the intel core 2 duo microprocessor, FMCAD '07: Proceedings of the Formal Methods in Computer Aided Design, pp. 192-195, 2007, Washington, DC, USA.

R. Beers, Pre-RTL Formal Verification: An Intel Experience, DAC '08: Proceedings of the 45th Annual Design Automation Conference, pp. 806-811, 2008, New York, NY, USA.

A. Gluska et al., Shortening the verification cycle with synthesizable abstract models, DAC '09: Proceedings of the 46th Annual Design Automation Conference, ACM, 2009, pp. 454-459, New York, NY, USA.

T. Groetker, System Design with SystemC, pp. 1-123, Kluwer Academic Publishers, 2002.

T. Groetker, System Design with SystemC, pp. 124-236, Kluwer Academic Publishers, 2002.

Non Final Office Action dated Oct. 5, 2011 for U.S. Appl. No. 12/340,677.

Notice of Allowance dated Mar. 29, 2012 for U.S. Appl. No. 12/340,677.

Non-Final Office Action dated Sep. 15, 2009 for U.S. Appl. No. 11/717,589.

Final Office Action dated Mar. 30, 2010 for U.S. Appl. No. 11/717,589.

Notice of Allowance dated Sep. 2, 2010 for U.S. Appl. No. 11/717,589.

Notice of Allowance dated Dec. 23, 2010 for U.S. Appl. No. 11/717,589.

\* cited by examiner

```
void receiver_process() {
  bool drop_all_until_llr_ack = 0;
  reset_interfaces();
  wait();
  while (1) {
    MSG msg = phy_in->get();
    if (! drop_all_until_llr_ack &&
        ! crc->check(msg)) {                          ← 410
      msg.set_type(LL_RETRY);
      ctrl_buf->put(msg);
      drop_all_until_llr_ack = 1;
    } else if (drop_all_until_llr_ack &&
               msg.get_type()==LL_RETRY_ACK) {
      drop_all_until_llr_ack = 0;
    } else if (! drop_all_until_llr_ack) {
      if (msg.get_type() == LL_ACK) {
        // Sender to flush retry buf
        ctrl_buf->put(msg);
      } else if (msg.get_type()==LL_RETRY) {
        msg.set_type(LL_RETRY_ACK);
        ctrl_buf->put(msg);
      } else {
        protocol_out->put(msg);
      }
    }
    wait();
  }
}
```

```
void receiver_process() {
  // ...
  wait();
  while (1) {
    MSG msg = phy_in->get();
    if (! drop_all_until_llr_ack &&
        ! crc->check(msg)) {
      // ...
    } else if (drop_all_until_llr_ack &&
               msg.type()==LL_RETRY_ACK) {
      // ...
    } else if (! drop_all_until_llr_ack) {
      if (msg.type() == LL_ACK) {
        // ...
      } else if (msg.type()==LL_RETRY) {
        // CASE EXPANSION
      } else if (msg.type()==SNOOP ___
                 msg.type()==SNOOP_RSP) {
        protocol_ctrl_out->put(msg);
      } else if (msg.type()==DRS) {
        protocol_data_out->put(msg);
      }
    }
    wait();
  }
}
```

```
template<typename MSG>
class CRC : public CRC_If<MSG>
,public sc_module {
public:
  virtual bool check (MSG m) {
    // replace nd stub with implementation
    sc_bigint<72> datain = m.data;
    sc_uint<8> dataout = 0;
    sc_uint<8> dataout0 = 0;
    for (unsigned int i=0; i<72; i++) {
      dataout0[0]= dataout[7] datain[i];
      dataout0[1]= dataout[0];
      dataout0[2]= dataout[1] dataout0[0];
      ...
      dataout0[7]= dataout[6] dataout0[0];
      dataout= dataout0;
    }
    return (m.crc == dataout);
  }
};
```

FIG. 5

METHOD AND SYSTEM FOR PERFORMING VERIFICATION OF AN ELECTRONIC DESIGN

BACKGROUND

Many phases of modern electronic design are performed with computer aided design (CAD) tools or electronic design automation (EDA) systems. To design an integrated circuit, a designer first creates high level behavior descriptions of the IC device using a high-level hardware design language (HDL). Common examples of HDLs include Verilog and VHDL. An EDA system typically receives the high level behavior descriptions of the IC device and translates this high-level design language into netlists of various levels of abstraction using a computer synthesis process. A netlist describes interconnections of nodes and components on the chip and includes information of circuit primitives such as transistors and diodes, their sizes and interconnections, for example.

Verification is a necessary step in the design cycle to ensure that the electronic circuit design will work for its intended purpose. After a circuit designer has created an initial design, the designer will typically perform verification and analysis upon the integrated circuit using a set of EDA verification tools.

As the quantity of data in modern electronic designs become larger and larger over time, it has become apparent that conventional EDA verification tools are unable to effectively and efficiently scale upwards to handle very large electronic designs, such as many modern microprocessor, SOC, and systems designs. For example, the ability of conventional verification tools to handle simulation or formal verification is incompatible with many modern integrated circuit (IC) designs being produced by electronics companies that are constantly increasing in complexity and number of transistors. The basic problem is that conventional simulation and formal verification tools are designed to handle much smaller sets of data than exists for modern designs. Due to the extremely large volume of data (e.g., RTL or register transfer level data) for many modern electronic designs, it is a very expensive and time-consuming process to verify large modern designs using conventional verification tools. With the modern trend towards increased functionality and feature sets for modern IC chips, as well as constantly improving IC manufacturing technologies that can create IC chips at ever-smaller feature sizes, this means that there are increasingly greater quantities of transistors and other objects to be placed within the same chip area that must be verified. This further renders conventional verification tools impractical for the job of verifying modern designs.

One possible approach that can be taken to address this problem is to perform verification of a circuit design at a higher level of abstraction. For example, transaction based verification is one possible approach for performing verification at a more abstracted level. With transaction based verification, low level signal activities are grouped together into common "transactions" and abstracted out, effectively removed from the model, and replace by function calls into a transaction level model (TLM). The idea is that verification at a higher abstraction level will provide faster and less expensive verification results due to the smaller amount of signal transitions that need to be simulated and data that must be verified.

The problem with this approach is that conventional transaction based verification tools do not provide a guarantee of relationship between the different abstraction levels. Therefore, there is no guarantee that error-free results identified at the transaction level will translate into error-free results at the signal level, and vice versa. As a result, an electronic design that undergoes TLM-based based verification will nonetheless also need to undergo complete RTL-based verification processing to ensure that there are no errors in the design (along with the costly time requirements and computing costs that go along with verification of full RTL for a circuit). As such, one may wonder why the transaction based verification even needs to be performed under this circumstance.

Therefore, there is a need for an improved approach to verification that can adequately handle large modern electronic designs.

SUMMARY

Some embodiments of the present invention address the above problems by providing an improved approach for designing and verifying electronic designs at different levels of abstractions. In some embodiments, an electronic design undergoes transaction level verification, where the results of the transaction level verification can be guaranteed to be correct at the RTL level. Embodiments of the invention define an enhanced TLM (referred to herein interchangeably as an "E-TLM" or a high-level model (HLM)) which is semantically consistent with the RTL, and refinement rules to insure the consistency is maintained. This can be implemented in some embodiments by ensuring that model consistency rules are followed to generate E-TLM models and/or RTL data. In this way, by virtue of the semantic consistency, properties that are verified at one level of abstraction will not need to be re-verified at the other level of abstraction Further details of aspects, objects, and advantages of the invention are described below in the detailed description, drawings, and claims. Both the foregoing general description and the following detailed description are exemplary and explanatory, and are not intended to be limiting as to the scope of the invention.

DETAILED DESCRIPTION

The present disclosure provides an improved approach for designing and verifying electronic designs at different levels of abstractions, such that properties that are verified at one level of abstraction will not need to be re-verified at the other level of abstraction. In some embodiments, an electronic design undergoes transaction level verification using an enhanced transaction level model (referred to herein interchangeably as an "E-TLM" or a high-level model (HLM)), where the results of the transaction level verification can be guaranteed to be correct at the RTL level.

Transaction-level modeling (TLM) is a known manner of performing abstraction of electronic designs in the EDA industry. A conventional TLM model abstracts away low-level implementation details, specifically signal-level communication protocol, into function calls, and is commonly (although not necessarily) written in the SystemC language.

As previously noted, the problem that exists with EDA tools that verify with abstracted high level models is that conventional verification tools do not provide a guarantee of relationship between the different abstraction levels. Therefore, there is no guarantee that error-free results identified at the transaction level will translate into error-free results at the signal level, and vice versa. This is because conventional modeling approaches only provide a vague and not necessarily consistent relationship between the models/data at the different levels of abstraction. For example, in contrast with completely general behavioral verification, there is an intrinsic problem with the current rules for TLM since TLM models use a shared variable or a message passing concurrency model, whereas RTL can use any signal-level communication scheme. TLMs are useful for modeling bus simple transfers, point-to-point message passing protocols and shared variables communications. A naive implementation of a TLM with message passing or shared variable concurrency can result in poor RTL, with unacceptable quality-of-results, meaning that the resulting circuit would have poor performance and/or be unnecessarily costly to synthesize. This means that the resulting RTL consistent with the TLM may be not to be acceptable to RTL designers because it requires extra handshakes, registers, buffers and memories that would not be present in efficient RTL. In addition, it may not be possible to model efficient RTL interfaces which do not use shared variable or message passing channels using the conventional TLM approaches; to write a TLM model that is semantically consistent with (e.g., is a conservative abstraction of) the RTL. Lastly, TLM tend to abstract threads by working with a sequential model, whereas a RTL model is highly concurrent, with a significant number of concurrent processes and interactions that are not observable in the TLM. It is not clear if one can write a TLM model for any RTL, or an RTL model for any TLM, and in that sense, it is not clear if it is a conservative and correct abstraction because one often cannot abstract and refine and get back to the same RTL structures.

Alternative approaches cannot perform a synthesis of TLM to RTL in a semantically consistent manner. For example, one possible approach is to convert a TLM model into an architectural model by following an interface-based methodology, using a transactor to convert the function-level communication into a signal-level protocol. However, transactors may introduce handshakes and buffers that undermine the efficiency of the resulting RTL. Thus, while conventional TLM is useful for certain classes of designs such as bus-based interfaces, it is generally challenging to build accurate TLM abstractions of efficient RTL. Production RTL uses sophisticated techniques to meet aggressive quality-of-results goals; and these techniques cannot be abstracted in a TLM model, and refining a TLM model will requires the introduction artifacts in the low-level model which are not part of the TLM.

These problems work against the goals of TLM that are meant to provide a more transparent representation of the RTL. While the current TLM structure may have some benefits, because of its lack of generality, it unfortunately thus deprives the designer of the possibility to use TLM to accelerate design verification through TLM verification. As a result, an electronic design that undergoes TLM-based based verification will also need to undergo complete RTL-based verification processing to ensure that there are no errors in the design. The problem is that transaction-level abstraction does not provide the abstraction where the design engineers need to do the refinements; they abstract something that is not part of the real design challenge; this is not where most of the time is spent. TLM are meant to simulate fast, and by omitting critical structures, these needs to be reintroduced in the RTL model. These structures are re-introduced in the design process, slowing down the TLM model; and eventually requiring rewriting the TLM into a lower level model.

The present disclosure addresses these problems by providing a methodology and framework for implementing semantically consistent designs at the different levels of abstraction. In some embodiments, an electronic design undergoes high-level verification with models that are semantically consistent with the RTL data, such that the results of the high-level verification are guaranteed to be also correct at the RTL level. Embodiments define a new kind of model, an enhanced TLM or E-TLM, which is different than a TLM, but which can be implemented by ensuring that model consistency rules are followed to generate E-TLM models and/or RTL data. In this way, properties that are verified at one level of abstraction will not need to be re-verified at the other level of abstraction.

In particular, this disclosure describes how to use high-level SystemC/TLM models with some modifications to the TLM structure (making them E-TLM) to implement a hierarchical design and verification methodology wherein high-level verification coverage can be inherited to the RTL. This allows one to take credit for high-level (system) verification (both simulation-based and formal), thereby rendering the corresponding RTL verification superfluous. RTL or cycle-accurate SystemC verification of low-level components such as ALUs and other data paths is still performed. However, since the low-level verification may be applied to isolated components, this provides a verification methodology that scales gracefully with increasing design size.

The disclosed methodology is based on abstraction through non-determinism of both latency and return values, in a manner that is not disclosed in prior approaches. The described models are semantically conservative abstractions of the RTL, which is what enables verification in the current high-level models to constitute "virtual" verification of the RTL. The current models are described as E-TLM models to distinguish from conventional TLM, since the current high level modeling versions of E-TLM span a range of abstraction levels that can be both more abstract and more concrete than the TLM models used in prior art, and at the same time are adequately flexible to provide semantically sound abstractions of efficient RTL.

Figure 1:
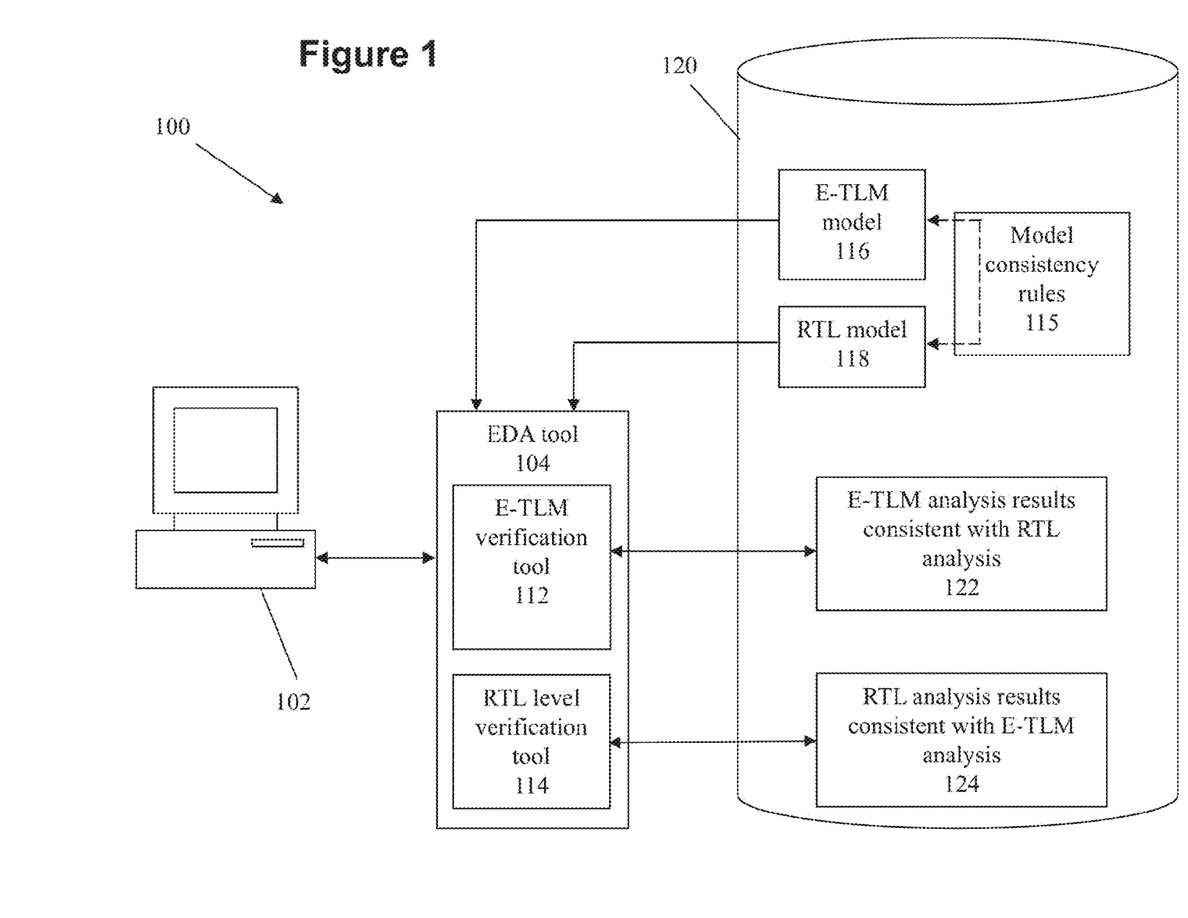
FIG. 1 shows a system for performing multiple abstraction verification of an electronic design according to an embodiment of the invention.

FIG. 1 shows an architecture of a system 100 for implementing verification according to some embodiments of the invention. System 100 may include one or more users at one or more user stations 102 that operate the system 100 to verify, design, edit, and/or plan electronic designs. The users at user station 102 correspond to any individual, organization, or other entity that uses system 100 for verifying an electronic design. Such users include, for example, chip architects, product designers, design engineers, and/or verification engineers. User station 102 comprises any type of computing station that may be used to operate, interface with, or implement EDA tools, applications or devices 104. Examples of such user stations 102 include for example, workstations, personal computers, or remote computing terminals. User station 102 comprises a display device, such as a display monitor, for displaying electronic design layouts and processing results to users at the user station 102. User station 102 also comprises one or more input devices for the user to provide operational control over the activities of system 100, such as a mouse or keyboard to manipulate a pointing object in a graphical user interface.

The user station 102 may be associated with one or more computer readable mediums or storage devices 120 that hold data regarding the user's electronic design. Computer readable storage device 120 comprises any combination of hardware and software that allows for ready access to the data that is located at the computer readable storage device 120. For example, computer readable storage device 120 could be implemented as computer memory operatively managed by an operating system. The computer readable storage device 120 could also be implemented as an electronic database system having storage on persistent and/or non-persistent storage.

EDA tools 104 include an E-TLM verification tool 112 and a RTL level verification tool 114. The E-TLM verification tool 112 performs verification on the E-TLM 116 for an electronic design. The RTL level verification tool 114 performs verification on the RTL data 118 for the same electronic design.

According to some embodiments of the invention, the transaction level verification tool 112 performs verification on the E-TLM 116, and will generate E-TLM analysis results 122 that are consistent with the analysis results 124 generated by the RTL level verification tool 114. Similarly, the RTL level verification tool 114 performs verification on the RTL data 118, and will generate RTL level analysis results 124 that are consistent with the E-TLM level analysis results 122 generated by the transaction level verification tool 112.

This result can be achieved because model consistency rules 115 are employed to require the E-TLM 116 to be restricted to the synthesizable subset of model components which can directly and unambiguously translate into RTL structures in the RTL data 118. The model consistency rules 115 thus limit the types of abstractions that can be made from its corresponding a set of RTL data 118. Similarly, the model consistency rules 115 limit the type and scope of expansion that can be performed to expand the abstractions within the E-TLM 116 into a set of corresponding RTL data 118.

Figure 2:
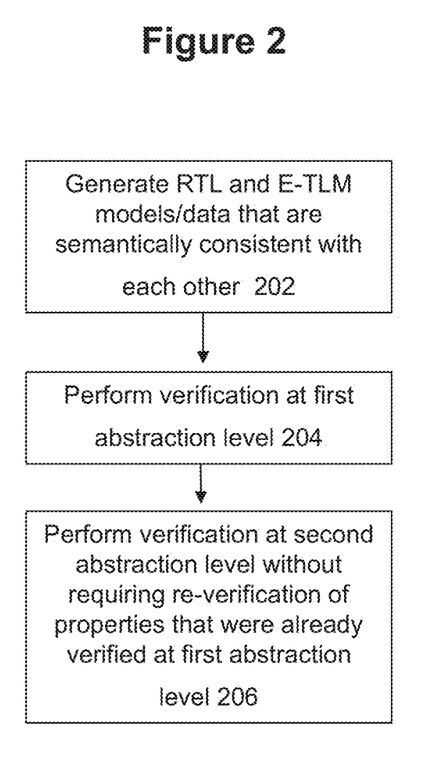
FIG. 2 shows a flowchart for performing verification at both the TLM and RTL model levels according to an embodiment of the invention.

FIG. 2 shows a flowchart of an approach for performing verification according to some embodiments of the invention. At 202, the E-TLM model and the R TL data are generated that are semantically consistent with one another. One set of data may be derived from another set of data. For example, the E-TLM data could be the initially generated set of data, with refinements added to the E-TLM model to arrive at the RTL data. As another example, one could start with the R TL data, and abstract data within the R TL data to achieve the E-TLM. In yet another embodiment, both the E-TLM and RTL data are concurrently created. Regardless, model consistency rules are used to ensure the semantic consistency between the different sets of data.

Also, the two sets of E-TLM and RTL models do not need to be contemporaneously created. Thus, one set of data could be created ahead of time, and the other set created much later. This situation may exist, for example, if a user has an existing library of RTL data that had previously been created, and now wishes to later synthesize E-TLM from the RTL data to perform verification according to the invention. Likewise, the user may have an existing set of E-TLM that were created in the past, now wishes to generate RTL data from the E-TLM models.

At 204, verification is performed at a first level of abstraction. Thereafter, at 206, verification is performed at the second level of abstraction without requiring re-verification of properties that were verified at the first level of abstraction. Because the data at the two levels of abstraction have been created with semantic consistency, this means that the verified properties at one level of abstraction will be consistent with the verification results at the other level of abstraction.

In practice, what this means is that the promise of greater efficiencies by performing transaction level verification can be realized by using embodiments of the present invention. Because the E-TLM model has much less data than the RTL data, this means that the E-TLM-based verification can be performed very quickly and inexpensively. Unlike the prior approaches, subsequent RTL-based verification does not have to repeat and re-verify any of the analysis that was previously performed with the E-TLM-based verification. Since the E-TLM data and the RTL data are semantically equivalent, "credit" is given to the E-TLM-based verification, with the assumption that properties and potential errors that were checked at the E-TLM level do not need to be re-checked at the RTL level. Instead, the RTL-based verification only needs to concentrate upon component-level verification at the localized level, thereby removing a great amount of time, costs, and data quantity that is required to perform the RTL-based verification. This means that the overall verification computing costs and time requirements for the verification process can be greatly reduced, making it now manageable to verify the vast amount of data that exist for modern electronic designs.

Figure 3:
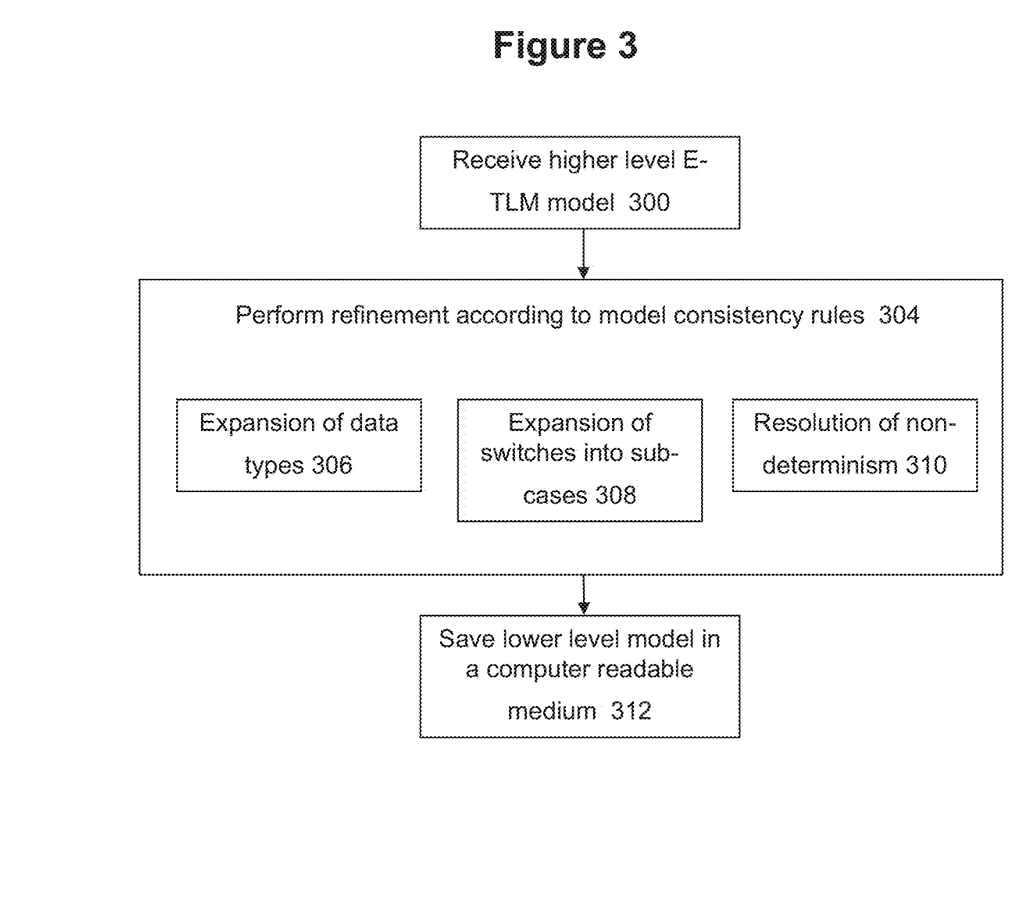
FIG. 3 shows a flowchart of an approach for synthesizing a RTL model from a TLM model according to an embodiment of the invention.

FIG. 3 shows a more detailed flowchart of an approach for generating semantically consistent models at different abstraction levels according to some embodiments of the invention. The approach of FIG. 3 is directed to the situation in which model refinement is performed to progress from a higher level E-TLM model to a more detailed RTL model.

At 300, the higher abstraction level E-TLM model is received. Many system-level design methodologies (e.g., implemented with SystemC) start with the creation of a transaction-level model that captures design behavior through function calls. Such models are used by engineers, for example, to perform early architecture exploration, functional validation, and to create virtual platforms for developing embedded software. These applications often require the ability to perform fast simulation, which is accomplished by abstracting out the details of concurrent thread and their signal-level communication through sequences of function calls.

At 304, refinement of the high-level model is performed based at least in part upon model consistency rules. A stepwise refinement approach is performed that allows the designer to add levels of design detail as required by the stepwise refinement process and at the same time ensures that the added details are consistent with the previous levels of abstraction. This is accomplished through a technique wherein at the higher levels of abstraction, lower level details are represented abstraction though specially designed placeholders or "stubs" whose high-level behavior is nondeterministic and thus captures all possible lower levels of behavior manifest once the stubs are replaced by actual design detail. The editing mechanism enforces the non-determinism of the stubs and the consistency of this non-determinism with the design details with which the stubs are eventually replaced, thus guaranteeing the conservative nature of the stepwise refinement hierarchy. One possible approach for performing this type of stepwise refinement is disclosed in U.S. Pat. No. 7,937,673, which is hereby incorporated by reference in it entirety.

Assuming the refinement process is in accords with an appropriate set of model/semantic consistency rules, this will cause a strong relationship of consistency to exist between the different abstraction levels of the design. Therefore, properties that are established or true at one level of the design remain true for all subsequent lower levels of abstraction of the design.

Soundness of the refinements can be implemented in some embodiments by adhering to model consistency rules that limit refinements to the following list:

(1) expansion of data types (306);
(2) expansion of switches into sub-cases (308); and
(3) resolution of non-determinism (310).

In this embodiment, other types of refinements would be prohibited; specifically, a E-TLM has the same SystemC macro-thread architecture as the RTL model, and has the same signal-level interface, making all the observable accessible to the E-TLM verification environment (unlike with a TLM). It is noted that other embodiments of the invention may correspond to differing sets of consistency rules, depending upon the specific applications to which the other embodiments of the invention are applied.

For rule 306, data types are expanded by refining tokens at the higher level of abstractions into specific data type elements with greater details at the lower levels of abstraction. For example, a higher level of abstraction may include a generalized concept of a "packet", which can be refined at lower levels of abstraction into the specific details of that packet, including the data type for the packet, specific data fields, any CRC checks, etc.

For rule 308, switches can be expanded into multiple details sub-cases for the switching element(s). For example, a switch at a higher level of abstraction may generally check whether a packet is "good" or "bad", and to perform different actions depending upon whether the packet is either good or bad. At a more detailed level, refinements may be performed to specify different combinations of elements that cause switching of actions to occur. The determination of "good" or "bad", more detailed levels of abstraction may contain different types of "good" or "bad", e.g., where checks are made whether a CRC check is good or bad, if the data values in particular data fields are good or bad, and/or whether a delay value associated with the packet is good or bad. Different combinations of the different "good" or "bad" values may comprise multiple sub-cases that are utilized for switching at lower levels of abstraction.

For rule 310, it is assumed that higher levels of abstraction will include non-deterministic properties that can be refined to a deterministic resolution of the properties at lower levels of abstraction. The current approach to implement this resolution of non-deterministic properties is to perform assignments at the lower levels of abstraction. The assignments themselves may include other non-deterministic properties, which will be resolved at a lower level of abstraction. In essence, the refinement process for removal of non-determinism is by making the abstract datapaths stubs into concrete deterministic datapath implementations. Non-determination at higher levels of abstraction relates to either delays values or computation outcomes which are resolved at lower levels of abstraction. For instance, at a higher level of abstraction, a particular global property may be checked where that property is nondeterministically analyzed regardless of the specific delay associated with a signal for that property. At lower levels of abstraction, that signal delay may be resolved to a deterministic delay value, e.g., through assignment or specification. Similarly, non-deterministic outcomes at higher levels of abstraction may be resolved to deterministic outcomes at lower levels of abstraction. If an abstract nondeterministic process is to be tested for consistency with a set of lower level process, then a full consistency check, (infinite trace preorder check) should be applied. In the current embodiment, this is not a recommended methodology; the E-TLM should be at a level where it includes all processes, either fully embodied or as sound abstractions.

Non-determinism can be encoded in RTL and modeled through the introduction of a synthetic input. For simulation, it can also be assigned randomly. Note that a representation of the delay associated with the computation is fundamentally important, since it is needed to test for possible concurrency bugs such as conflicts or race conditions relative to other concurrent actions.

Once the necessary refinement(s) have occurred, then at 312, the model at the lower and more detailed level of abstraction (e.g., RTL model) is saved into a computer readable medium. The lower level model can thereafter be used for verification at a lower level of abstraction, but with confidence that verification results will be consistent with results at the higher level of abstraction. As such, any properties that were verified at the higher level of abstraction will not need to be re-verified at the lower level of abstraction.

This process therefore provides a mechanism for synthesizing E-TLM models into RTL models. This is particularly advantageous because of the significant investments that have been made by many companies in the development and testing of TLM models which can be transformed into E-TLM in a straightforward way. For example, the current embodiment therefore provides the necessary mechanisms to maintain a semantic relationship between RTL traces and higher-level model traces. The signal-level protocols implementing communications are semantically consistent, and will therefore prevent transactions from interfering with each other and potentially exercising undesirable behaviors that are not observable when the transactions are TLM transitive function calls. Likewise, the present approach can be used to allow TLM to account for low-level actions such as reset and concurrency, deadlocks and resource conflicts in the RTL that may not be detectable with a TLM which is sequential and based strictly on function calls (message passing or shared variables). This is accomplished by restricting TLM models to a synthesizable subset of elements which can directly and unambiguously translate into RTL structures. The only abstractions that are allowed in a E-TLM in some embodiments is nondeterminism and abstract data types. For example, some embodiments require all the external interfaces of components to be at the signal-level and not through TLM interfaces. Additionally, shared variables communication and immediate event notifications would be precluded. One can consider SystemC processes to be Moore machines, where each transition is from/to a program counter location that denotes either the initial node of the graph, a node which corresponds to a wait statement, or the exit node of the graph. The intermediate micro-transitions between the other SystemC statements are collapsed into these macro-transitions. This effectively simplifies the semantics of SystemC to the classical synchronous semantics, enabling efficient analysis with simulators and model checkers.

There are at least two ways to utilize the presently disclosed versions of E-TLM. One is systematic and the other is ad hoc. The ad hoc utilization can be applied to existing RTL to accelerate verification, where E-TL models are written for certain RTL structures and employed in verification and in which the amount of verification acceleration is proportional to the number of E-TL models written. This ad hoc utilization provides a useful means for a verification group to experiment with the methodology, where a smaller amount of effort yields a smaller amount of acceleration, but increased efforts yields increased acceleration. Therefore, the ramp-up costs and technology transfer effort can be limited.

In the systematic approach, acceleration of RTL verification is one of several benefits, with others being earlier debug abilities and a more transparent design. However, the ramp-up costs and technology transfer effort for the systematic approach may be considerably greater than the ad hoc approach. In the systematic approach, one begins with a hierarchy imposed on the given design specification. Design specification properties (defined by simulation monitors or formal verification assertions) are partitioned according to their respective extent of locality. More global (system) properties sit higher in the hierarchy. A system design hierarchy is induced from the specification hierarchy. The granularity of E-TL models is determined by the degree of locality of respective design specification properties. The more global properties give rise to more abstract E-TL models, which are utilized to verify those properties.

Higher-level E-TL models thus tend to be more control-oriented than TLM, with the consequence that in the systematic approach, control gets implemented before data paths. This is consistent with modern design practices for control-dominated designs, permitting the designer to get functional debug feedback as soon as the control flow is coded well before the completion of RTL coding. It is well-known that earlier debug can significantly accelerate design development by highlighting functional bugs while the design is still fluid. Likewise, it comes early enough in the design development flow to permit inexpensive redesign. In order to code controllers first, data structures are represented by semantic stubs that constitute both abstract data types for the data and at the same time provide a conservative abstraction of the ultimately refined data type.

In both the systematic and ad hoc approaches, E-TL models must be sound abstractions of the corresponding RTL. Therefore, there must be a mapping of RTL signal assignments to E-TL model events in such a way that each RTL trace gives rise to a E-TLM trace of the corresponding events. In the systematic approach one starts with E-TL models, verifies properties relative to them and then refines them to lower level E-TL models with which to verify lower level properties, and ultimately refines these down to RTL. Each of these refinement steps must be sound as above, in order to be able to take credit for the higher level verification.

In the ad hoc approach, one starts with RTL and generates E-TL models to be utilized for verification. Here as well, these models must be sound abstractions of the corresponding RTL. This could be accomplished by reversing the above three rules for various design structures like FIFOs, shift registers, ALUs, pipelines and so on. However, greater flexibility for writing abstractions may be required. In this case, the correctness of the abstraction may need to be formally verified. This is the only step in the methodology that would depend on formal verification, needed to prove soundness. This step can be applied component-by-component, in a scalable manner.

To illustrate embodiments of the invention, consider the scenario in which there is a (global) design specification property that stipulates "if [at a certain control point] the CRC of a message data field is good, then the design must do 'this', else it must do 'that'. To test this property, a representation in the design model of the CRC check itself and even of the message handling mechanism would be irrelevant. All that is needed is a representation of the possible outcomes: there is some delay and then it is determined that the CRC is either good or bad. The TLM model derived for this property would be a "semantic stub" whose latency (relative to other parallel design actions) is determined by a nondeterministic choice of {pause, done}, while the possible CRC function returns of {good, bad} likewise are modeled by a nondeterministic choice (given done).

A more local design specification property (lower in the design specification hierarchy) may govern local message handling for the CRC. To test this property, one would need a stub for this same function that provided a bit-level representation of the associated data path, but this function model stub may still abstract the shift register that computes the actual CRC, to an empty call (so no shift register is actually coded here), with nondeterministic latency and returns, as before.

A low-level design specification property may stipulate that the CRC implementation conforms to a stated algorithm (correctly divides by the generator), or it may simply state that for a testbench word generator that generates both correct and corrupted words, the implementation correctly distinguishes them. For this, the complete RTL or cycle-accurate SystemC would be used in the verification (no abstraction), so verification of this property would be deferred to the lowest level.

In summary, the three properties are verified at three successive levels of abstraction, and during the RTL verification of the third level, one can infer the coverage results from the verification runs at the higher levels.

Although this flow makes it appear as though the designer must encode n separate models of the same design for n levels of abstraction, this is not the case in some embodiments of the invention. In the hierarchical design flow described herein, the design can be coded only once. The various levels of abstraction are derived from the order of coding. For example, conventionally one would code the CRC-calling function monolithically, integrating its control flow, message-handling and the CRC computations in a single flat piece of code. In the hierarchical design flow described here, one might first code the function's control flow: it accesses a word, feeds it to a shift register for the CRC computation and returns the result. This first part of the coding could thus entail writing mainly the function's syntactic capsule with its arguments and returns, and its call to a shift register for the numerical computation to be applied to the input word passed by the function, but not the shift register-based CRC algorithm itself nor the details of message-handling. In order to support verification that includes this high-level representation of the CRC-calling function, its latency and its return would be chosen nondeterministically (the coding of these choices could be automated, based on the return type of the function and the designation of the code as a "stub"). With this stub, properties could be tested that do not depend on the details of message-handling or how the CRC computations are performed, but only depend on the return value of the CRC.

Next, the CRC-calling function code might be augmented to add a mechanism for message extraction. It is important that this is an augmentation, not a re-writing: new code is added to the original code, defining a code refinement. At this level of abstraction the design could be tested to ensure that the message is properly handled, and this would entail a bit-level representation of the associated data paths. This refinement could be implemented by replacing the higher-level function's abstract data type for message by the appropriate word type. Thus, the new model is derived from the previous model by adding code to the previous model.

Eventually, coding is completed by fully expanding data paths and adding the CRC shift register, finally supporting low-level local checks such as the correctness of the CRC.

Thus, the CRC-calling function is coded only once, but in a different order than conventionally. Considering a design with many such functions, at first the "high-level" parts of all the functions are coded and tested; next, each function is augmented, writing more of its code, as appropriate for properties to be tested at the next level of abstraction. And so on, until all the coding of all the functions is complete. Each successive model starts with the higher-level model and expands it, until the coding is complete.

Figure 4A:
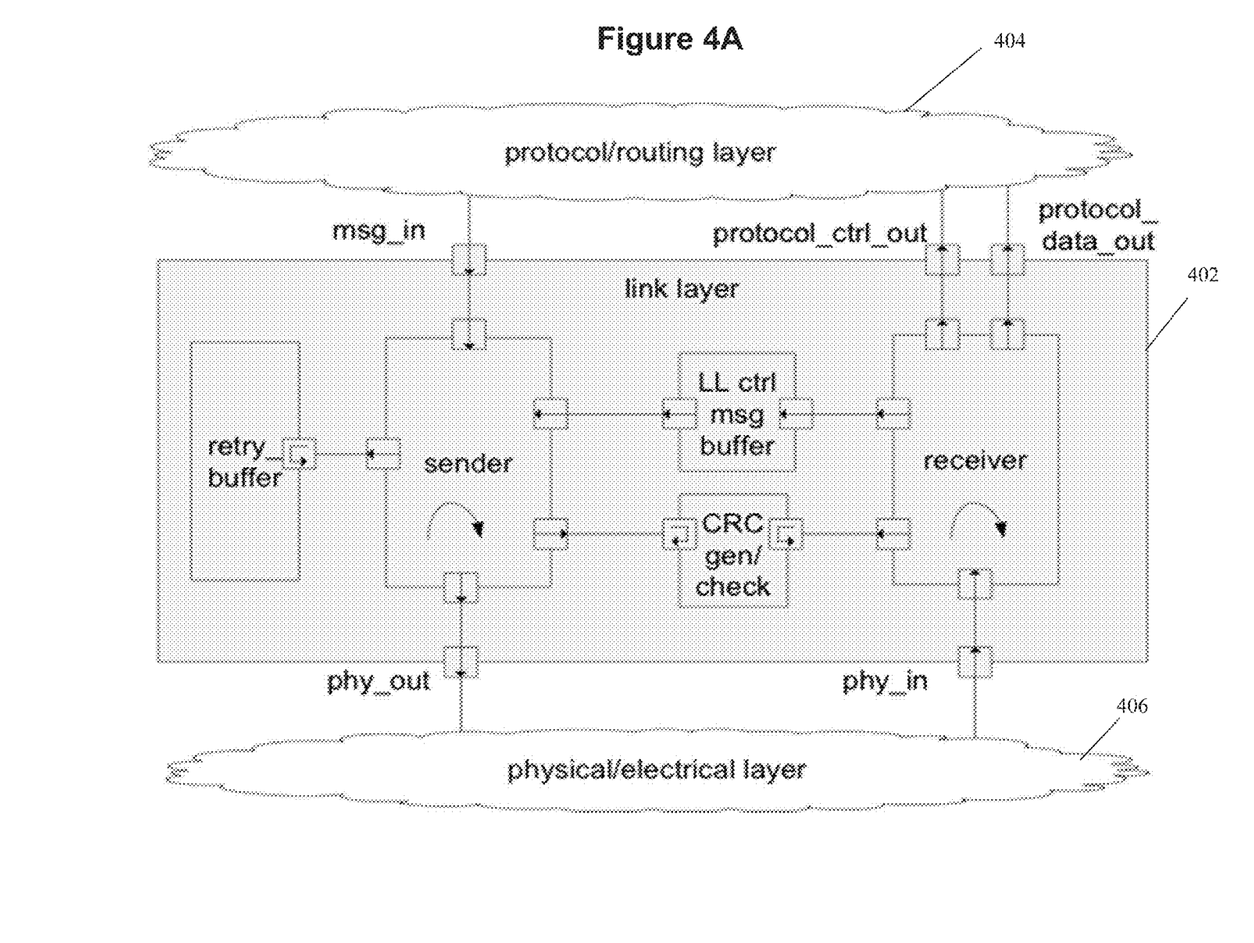
FIGS. 4A-E provide an illustrative example of an embodiment of the invention.

This disclosure will now provide an illustrative example of an implementation of the invention. FIG. 4A shows a diagram for a simplified model of a link layer controller in an on-chip multiprocessor interconnect (e.g., based on the Intel Quick-Path architecture). The link layer 402 receives messages from a protocol (or routing) layer 404 and is required to transmit them over the physical layer 406, and vice-versa. An error detection mechanism is used that adds the CRC code to messages before sending them to the physical layer 406. The message receiver will have the sender send a retry request if its CRC check fails. A go-back-N pattern is entered, starting from a specific message that is in the retry buffer. This receiver communicates with the sender through the control buffer labeled "LL ctrl msg buffer". When messages are received and pass the CRC check, an "ack" message is sent, but only every eight messages. When the receiver receives the "ack" message, it instruct the sender to clear its the retry buffer. In this model, the size of messages is 80 bits, with 8 bits for the CRC and 72 bits for the payload. The retry buffer holds 8 messages, and the control buffer holds only one message. To verify this design, one can build a hierarchy of properties from global properties to more localized properties.

As an example of a high level (global) property, one can choose part of the required cooperation between the sender and the receiver. In particular, one can check the following properties: (1) P1: when a retry-request is received, a retry-ack is sent back, and (2) P2: when an ack is received, the sender clears the retry-buffer.

Figure 4B:
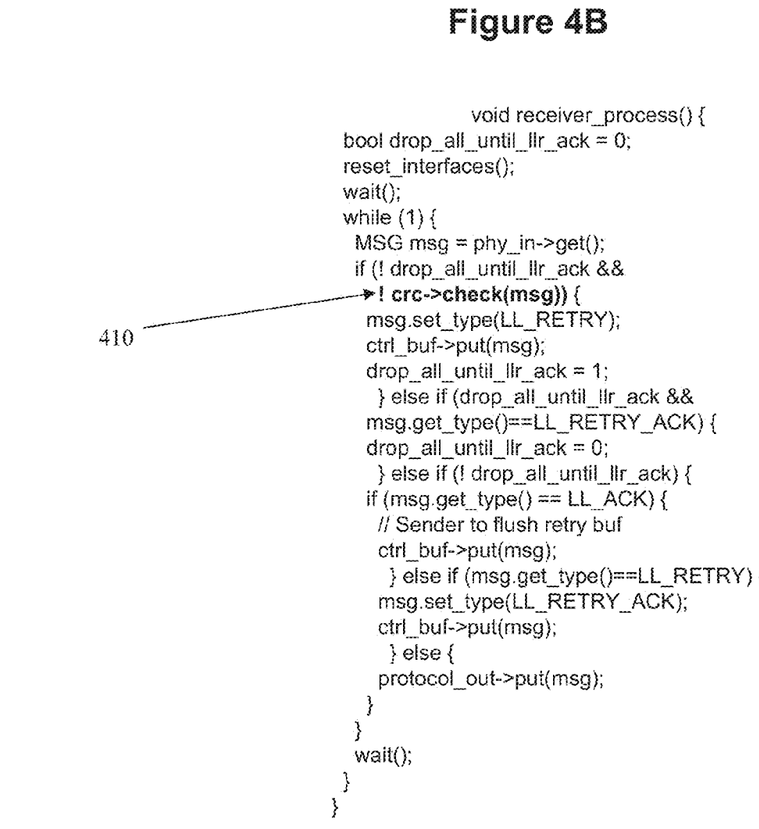

As shown in FIG. 4B, the control-flow can be encoded to exercise the scenarios where the receiver and the sender processes cooperate in implementing this functionality. The process checks if a message passes the CRC, and if not, it sends a retry request through the control buffer. Then, it ignores all other incoming messages until it get an acknowledgement for the retry request. Note that this process utilizes a semantic stub 410 for the CRC.

At this level, the receiver does not distinguish between different message types (control vs. data), which is unnecessary to verify properties P1 and P2. Indeed, one may apply the following data path abstractions: (1) computation (data path) abstraction: the abstract CRC function nondeterministically returns pass/fail, after a nondeterministic delay; (2) data type abstraction: the data type for the message is abstracted to use only 1 bit for the payload and for the CRC, reducing its size to 10 bits needed for properties p1 and p2; and (3) buffer abstraction: the retry buffer is a standard nondeterministic buffer abstraction that once it has a message in it, may contain any positive number of messages.

Figure 4C:
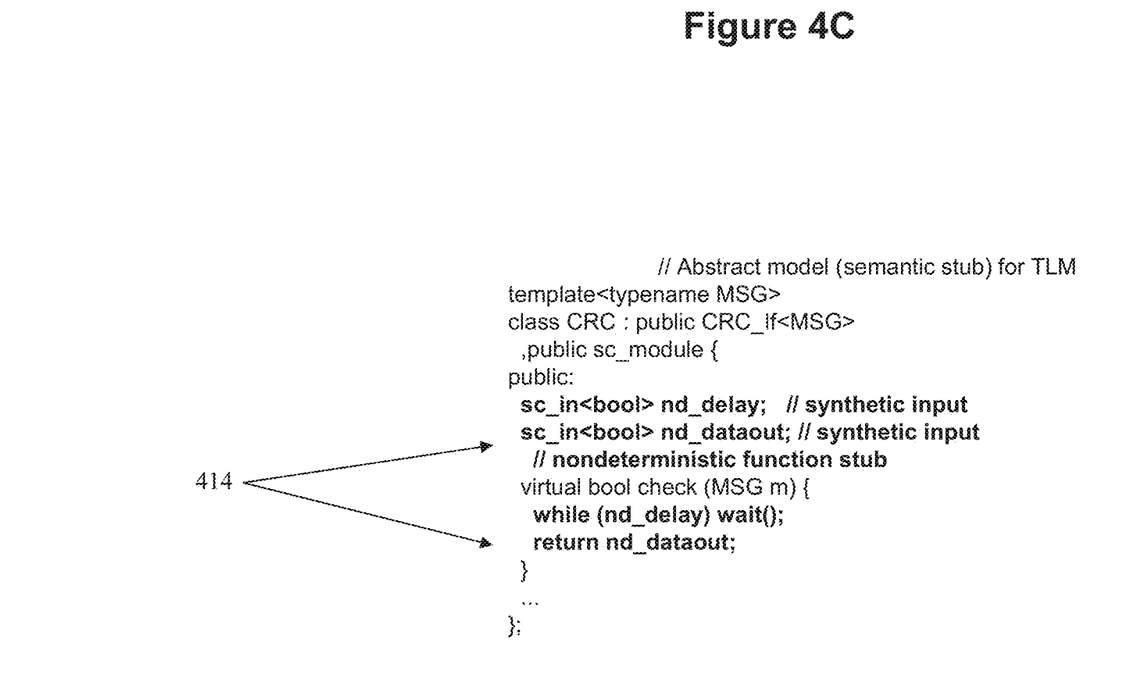

The CRC function 410 called from the receiver process above is modeled as a "semantic stub" in the global model with nd_* input ports denoting synthetic inputs that define nondeterministic choices 414 as shown in FIG. 4C. These can be assigned randomly in simulation. The abstract model of the CRC essentially behaves as a nondeterministic function that is used in verifying the system-level model. The nd_* inputs are used to determine the extent of the CRC delay and return value.

Figure 4D:
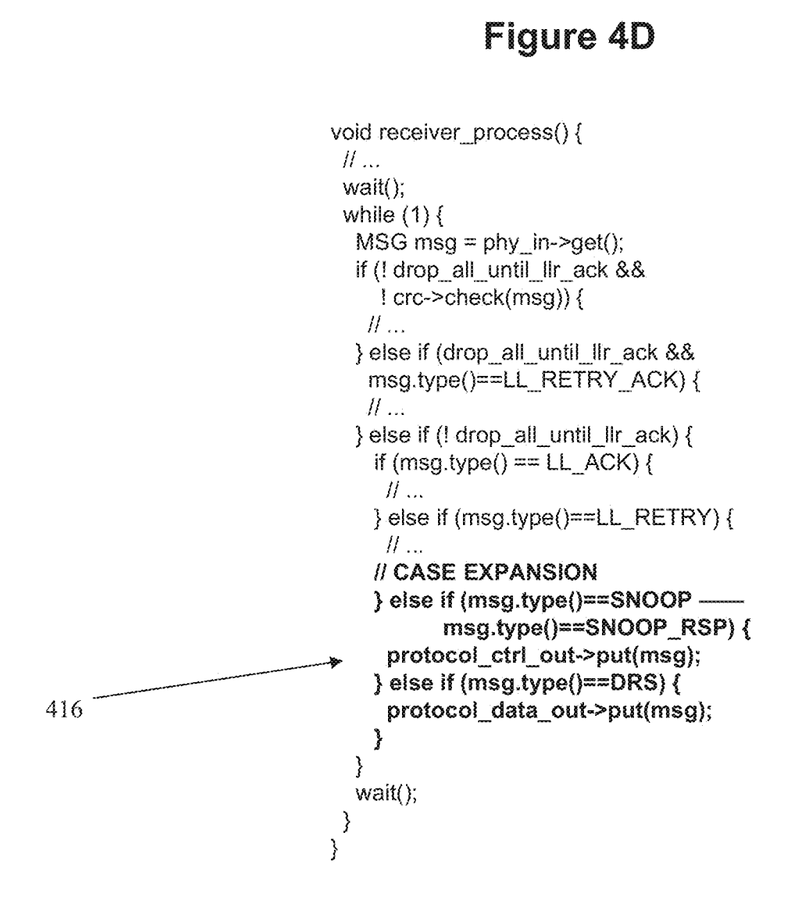

As shown in FIG. 4D, the second level of properties is localized to the sender and receiver processes, and describes the control flow between these processes and the upper protocol and lower physical layers. For instance, when a snoop response is received from the physical layer and the CRC passes, it is immediately forwarded to the protocol layer. Likewise, when a request is passed from the protocol layer to the sender and the retry buffer is not full and no link-layer specific message to send, the CRC is added to the message and it is then immediately sent to the physical layer. This refinement is done by augmenting the cases in the if statement in the receiver (and sender) processes to process the different kinds of messages sent by the protocol layer, distinguishing data and control messages. In this case, the CRC is the same, but one will refine its data type parameter to be consistent with the refined message types. The receiver process is modified to add the case refinement and data type refinement (416), to send messages back to the protocol layer on control and data channels.

Figure 4E:
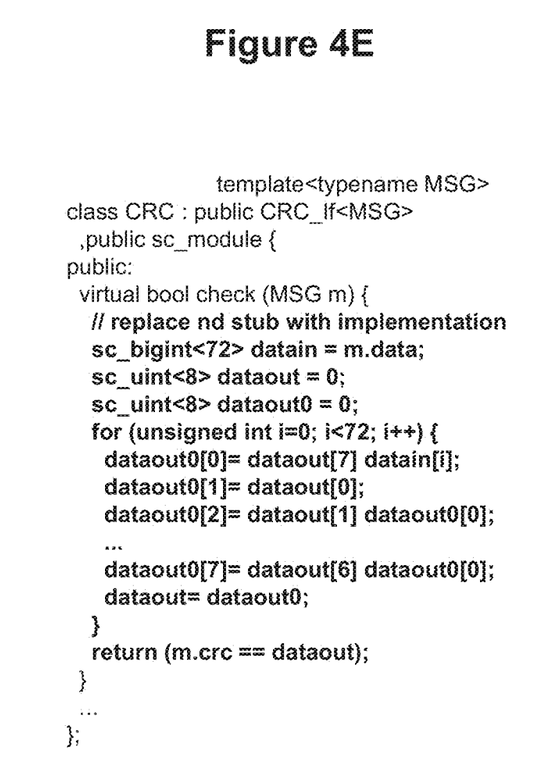

The third level of properties is localized to the retry buffer and to the CRC generator/checker. Here, the properties are to check that the buffer properly enqueues its messages, and that they are added/popped in the correct order. In this context we verify the CRC function. The CRC code for this third refinement is shown in FIG. 4E. The designer can then use the microarchitecture command to unroll the loop, and to optimize the logic to get a parallel computation into efficient RTL.

Therefore, what has been described is an improved approach for implementing a verification mechanism and methodology, which can be used to verify electronic designs at different levels of abstractions. This allows the electronic design to undergo transaction level verification, where the results of the transaction level verification can be guaranteed to be correct at the RTL level, and vice versa. In this way, properties that are verified at one level of abstraction will not need to be re-verified at the other level of abstraction.

System Architecture Overview

Figure 5:
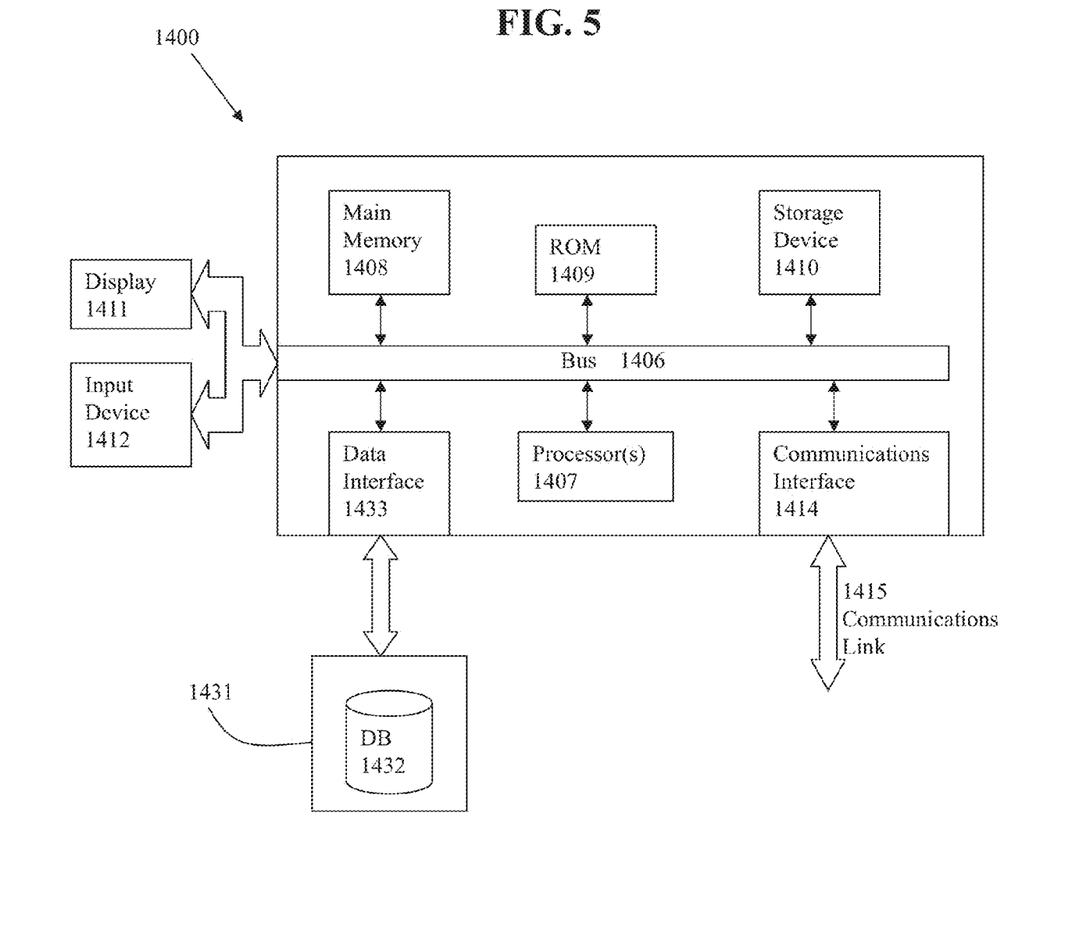
FIG. 5 shows an architecture of an example computing system with which the invention may be implemented.

FIG. 5 is a block diagram of an illustrative computing system 1400 suitable for implementing an embodiment of the present invention. Computer system 1400 includes a bus 1406 or other communication mechanism for communicating information, which interconnects subsystems and devices, such as processor 1407, system memory 1408 (e.g., RAM), static storage device 1409 (e.g., ROM), disk drive 1410 (e.g., magnetic or optical), communication interface 1414 (e.g., modem or Ethernet card), display 1411 (e.g., CRT or LCD), input device 1412 (e.g., keyboard), and cursor control.

According to one embodiment of the invention, computer system 1400 performs specific operations by processor 1407 executing one or more sequences of one or more instructions contained in system memory 1408. Such instructions may be read into system memory 1408 from another computer readable/usable medium, such as static storage device 1409 or disk drive 1410. In alternative embodiments, hard-wired circuitry may be used in place of or in combination with software instructions to implement the invention. Thus, embodiments of the invention are not limited to any specific combination of hardware circuitry and/or software. In one embodiment, the term "logic" shall mean any combination of software or hardware that is used to implement all or part of the invention.

The term "computer readable medium" or "computer usable medium" as used herein refers to any medium that participates in providing instructions to processor 1407 for execution. Such a medium may take many forms, including but not limited to, non-volatile media and volatile media. Non-volatile media includes, for example, optical or magnetic disks, such as disk drive 1410. Volatile media includes dynamic memory, such as system memory 1408.

Common forms of computer readable media includes, for example, floppy disk, flexible disk, hard disk, magnetic tape, any other magnetic medium, CD-ROM, any other optical medium, punch cards, paper tape, any other physical medium with patterns of holes, RAM, PROM, EPROM, FLASH-EPROM, any other memory chip or cartridge, or any other medium from which a computer can read.

In an embodiment of the invention, execution of the sequences of instructions to practice the invention is performed by a single computer system 1400. According to other embodiments of the invention, two or more computer systems 1400 coupled by communication link 1415 (e.g., LAN, PTSN, or wireless network) may perform the sequence of instructions required to practice the invention in coordination with one another.

Computer system 1400 may transmit and receive messages, data, and instructions, including program, i.e., application code, through communication link 1415 and communication interface 1414. Received program code may be executed by processor 1407 as it is received, and/or stored in disk drive 1410, or other non-volatile storage for later execution.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. The specification and drawings are, accordingly, to be regarded in an illustrative rather than restrictive sense.

The invention claimed is:

1. A computer-implemented method implemented with a processor for verifying a design, comprising:
   using at least one computing system to perform a process, the process comprising:
   implementing an enhanced transaction level model that groups and abstracts activities of an electronic design into one or more transactions at a higher level of abstraction than an RTL level model;
   implementing the RTL level model of the electronic design at a lower level of abstraction;
   verifying a property in the electronic design at a first level of abstraction to determine whether the property functions for its intended purpose, wherein the first level of abstraction is selected to correspond to either the enhanced transaction level model or the RTL level model; and
   verifying the electronic design at a second level of abstraction after verifying the electronic design at the first level by using one or more model consistency rules to expand at least one data type and to promote determinism, without requiring re-verification of the property that was verified earlier at the first level of abstraction, wherein the enhanced transaction level model is semantically equivalent to the RTL level model.

2. The method of claim 1 in which the RTL model and the enhanced transaction level model are semantically consistent with each other.

3. The method of claim 2 in which model consistency rules are utilized to cause the RTL model and the enhanced transaction level model to be semantically consistent with each other.

4. The method of claim 3 in which the model consistency rules limit refinement of the enhanced transaction level model to (a) expansion of data types, (b) expansion of switches to sub-cases, and (c) resolution of non-determinism.

5. The method of claim 4 in which the resolution of non-determinism corresponds to resolution of delay or outcome non-determinism.

6. The method of claim 4 in which the resolution of non-determinism is implemented by assignment or specification.

7. The method of claim 3 in which the model consistency rules limit abstraction of the RTL level model to (a) abstraction of data types, (b) abstraction of switches, and (c) imposition of non-determinism.

8. The method of claim 1 in which the enhanced transaction level model is successively refined to the RTL level model.

9. The method of claim 8 in which one or more semantic stubs are employed to implement successive refinement.

10. The method of claim 1 implemented on a systematic or ad hoc basis.

11. A computer program product embodied on a non-transitory computer usable medium, the non-transitory computer readable medium having stored thereon a sequence of instructions which, when executed by a processor causes the processor to execute a process for verifying a design, the process comprising:
    implementing an enhanced transaction level model that groups and abstracts activities of an electronic design into one or more transactions at a higher level of abstraction than an RTL level model;
    implementing an RTL level model of the electronic design at a lower level of abstraction;
    verifying a property in the electronic design at a first level of abstraction to determine whether the property functions for its intended purpose, wherein the first level of abstraction is selected to correspond to either the enhanced transaction level model or the RTL level model; and
    verifying the electronic design at a second level of abstraction after verifying the electronic design at the first level by using one or more model consistency rules to expand at least one data type and to promote determinism, without requiring re-verification of the property that was verified earlier at the first level of abstraction, wherein the enhanced transaction level model is semantically equivalent to the RTL level model.

12. The computer program product of claim 11, the process further comprising:
    generating the RTL level model and the enhanced transaction level model that are semantically consistent with each other.

13. The computer program product of claim 11, the process further comprising:
    performing one or more refinements on the enhanced transaction level model based at least in part upon one or more consistency rules.

14. The computer program product of claim 13, in which the one or more consistency rules are used to limit the one or more refinements on the enhanced transaction level model.

15. The computer program product of claim 13, the process further comprising:
    using the one or more consistency rules to expand a data type by at least refining one or more tokens at the higher level of abstraction into one or more specific data type elements with greater details at the lower level of abstraction.

16. The computer program product of claim 13, the process further comprising:
    using the one or more consistency rules to expand a switch at the higher level of abstraction into multiple sub-cases for one or more switching elements by at least specifying combinations of the one or more switching elements that cause switching of actions to occur.

17. The computer program product of claim 13, the process further comprising:
using the one or more consistency rules to refine a non-deterministic property at the higher level of abstraction to a deterministic resolution at the lower level of abstraction by performing one or more assignments.

18. The computer program product of claim 11, the process further comprising at least one of:
synthesizing the enhanced transactional level model into the RTL level model;
maintaining a semantic relationship between RTL level model traces and enhanced transactional level model traces;
preventing an exercise of non-observable behavior by one or more transaction level model transitive function calls;
permitting the transaction level model to account for one or more low-level actions by at least restricting the transaction level model to a synthesizable subset of elements that are characterized by being capable of being translated into one or more corresponding RTL level structures; and
precluding shared variable communication or immediate even notifications.

19. A system for verifying a design, comprising:
a processor; and
a memory for holding programmable code, wherein the programmable code includes instructions which, when executed by the processor, cause the processor to:
implement an enhanced transaction level model that groups and abstracts activities of an electronic design into one or more transactions at a higher level of abstraction than an RTL level model;
implement an RTL level model of the electronic design at a lower level of abstraction;
verify a property in the electronic design at a first level of abstraction to determine whether the property functions for its intended purpose, wherein the first level of abstraction is selected to correspond to either the enhanced transaction level model or the RTL level model; and
verify the electronic design at a second level of abstraction after verifying the electronic design at the first level by using one or more model consistency rules to expand at least one data type and to promote determinism, without requiring re-verification of the property that was verified earlier at the first level of abstraction, wherein
the enhanced transaction level model is semantically equivalent to the RTL level model.

20. The system of claim 19, in which the processor is further to:
generate the RTL level model and the enhanced transaction level model that are semantically consistent with each other.

21. The system of claim 19, in which the processor is further to:
perform one or more refinements on the enhanced transaction level model based at least in part upon one or more consistency rules.

22. The system of claim 21, in which the one or more consistency rules are used to limit the one or more refinements on the enhanced transaction level model.

23. The system of claim 21, in which the processor is further to:
use the one or more consistency rules to expand a data type by at least refining one or more tokens at the higher level of abstraction into one or more specific data type elements with greater details at the lower level of abstraction.

24. The system of claim 21, in which the processor is further to:
use the one or more consistency rules to expand a switch at the higher level of abstraction into multiple sub-cases for one or more switching elements by at least specifying combinations of the one or more switching elements that cause switching of actions to occur.

25. The system of claim 21, in which the processor is further to:
use the one or more consistency rules to refine a non-deterministic property at the higher level of abstraction to a deterministic resolution at the lower level of abstraction by performing one or more assignments.

26. The system of claim 19, in which the processor is further to:
synthesize the enhanced transactional level model into the RTL level model;
maintain a semantic relationship between RTL level model traces and enhanced transactional level model traces;
prevent an exercise of non-observable behavior by one or more transaction level model transitive function calls;
permit the transaction level model to account for one or more low-level actions by at least restricting the transaction level model to a synthesizable subset of elements that are characterized by being capable of being translated into one or more corresponding RTL level structures; or
preclude shared variable communication or immediate even notifications.

* * * * *